United States Patent [19]

Doundoulakis

[11] 4,348,636
[45] Sep. 7, 1982

[54] INTEGRATED CIRCUIT TESTER

[76] Inventor: George J. Doundoulakis, 2498 Kayron La., North Bellmore, N.Y. 11710

[21] Appl. No.: 167,136

[22] Filed: Jul. 9, 1980

[51] Int. Cl.³ .............................................. G01R 15/12
[52] U.S. Cl. ............................... 324/73 R; 324/158 R
[58] Field of Search ............. 324/158 R, 158 T, 73 R, 324/73 PC, 73 AT

[56] References Cited

U.S. PATENT DOCUMENTS 3,870,953  3/1975  Boatman et al. ................. 324/158 T

*Primary Examiner*—Ernest F. Karlsen
*Attorney, Agent, or Firm*—Constantine A. Michalos

[57] ABSTRACT

An integrated circuit tester, comprising switching means for adjusting the logic state of the pins of a test socket to a logic state of "1" and "0" and following a debounced pulsating signal, depending on the logic function and mode of operation of the IC chip under test. Electronic detection means serve to detect the logic state of each pin which is then displayed by luminous means. A card library of IC diagrams provides a diagram for each IC chip that can be tested by the invention with pin numbers, supported adjacent to the luminous display means, so that the significance of each pin is clearly demonstrated. The whole or part of the chip under test is detected as faulty if the pattern of the luminous display with the pulsating signal connected to predetermined input pins, does not obey the predetermined operation of the chip under test.

The tester also provides extentions so that the pins of the test socket may be connected to a breadboarding strip and to in circuit operating IC chips.

10 Claims, 4 Drawing Figures

INTEGRATED CIRCUIT TESTER

FIELD OF INVENTION

This invention relates in general to electronic test equipment and particularly to such equipment for use in testing a multitude of standard integrated circuit units.

DESCRIPTION OF THE PRIOR ART

The modern method of accomplishing digital electronic systems has been precipitated around the use of elementary standard IC (integrated circuit) units. These IC units comprise a small semiconductor circuit referred to as a "chip" encapsulated inside a standard DIP (Dual In-line Package) plastic case. Standard pins, spaced 0.1 inches, extending along two opposite sides of the case, serve to interface the terminal points of the chip with the terminal points of the digital circuit. Depending on the method of construction, chips are distinguished as belonging to various families, such as the TTL (Transistor Transistor Logic), the RTL (Resistor Transistor Logic), the CMOS (Complimentary Metal Oxide Semiconductor), etc.

Regardless of the type of construction or the specific design, each IC chip provides at least 2 pins for connection to a power supply, a number of pins for receiving input signals and a number of output pins. An IC chip, thus may be seen as a logical black box capable of operating on input signals in a predetermined manner thereby converting them into output signals.

Due to faulty manufacture or misuse I.C. chips may become faulty so that test equipment are needed for testing. There are also instances where the reason an IC chip does not perform in a particular digital circuit comes from a bad connection or the shorting of terminals. An IC tester can provide clues of the trouble.

There have been a number of IC testers in the market. A class of such testers provides automation implemented through the use of microprocessors. Such testing equipment are complicated and sufficiently expensive to remain beyond the reach of the average engineer. Another class of test equipment used in connection with IC chips, comprises LED (Light-Emitting Diode) displays indicating the logic state of the IC pins, but do not provide testing signals, or information as to the significance of each pin.

The present invention provides means for setting a combination of test signals appropriate to the particular IC chip under test. Specifically, switching means can be set to connect to ground or to a debounced pulse a chosen combination of IC pins. The invention further provides for card diagrams of each IC chip to be used in conjunction with an LED display, so that the significance of each pin of the IC chip is clearly shown, during testing.

The invention also provides plug-in extentions for direct interconnection with external circuits and an on-unit breadboarding strip.

SUMMARY OF THE INVENTION

The present invention provides for an IC tester with means for setting pins of the IC chip under test at a logic state of "1" or "0" or in contact with a debounced input pulse. It also provides for a continuous LED display of the logic state of each IC pin in conjunction with a card diagram of each IC chip under test, interposed among the LED display to indicate the significance of each pin in the IC chip under test. The shifting of LED pattern as the input pulse is applied, clearly shows malfunction of any of the elements of the IC chip under test.

Accordingly, an object of the present invention is to provide an IC tester for the detection of faulty elements in a digital circuit employing IC chips.

It is a further object of the present invention to provide a small size, inexpensive and versatile IC tester.

It is another object of the present invention to provide an IC tester comprising a display operating in conjunction with the electronic diagram of the chip under test so that faulty elements of the chip can become immediately apparent.

It is another object of the present invention to provide an IC tester with means for connecting a particular pin combination to ground and a particular pin combination to a debounced input pulse—such pin combination being appropriate for the IC chip under test.

It is another object of the present invention to provide an IC tester with means for connecting a particular pin combination directly to a predetermined voltage supply potential.

It is a further object of the present invention to provide an IC tester with means for interconnecting its electronics with an external circuit.

It is another object of the present invention to provide an IC tester having its own power supply.

The various features of novelty which characterize the invention are pointed out with particularity in the claims annexed to forming a part of this disclosure. For a better understanding of the invention, its operating advantages and specific objects attained by its uses, reference should be had to the accompanying drawings and descriptive matter in which there is illustrated a preferred embodiment of the invention.

DESCRIPTION OF THE PREFERRED EMBODIMENT

Figure 1:
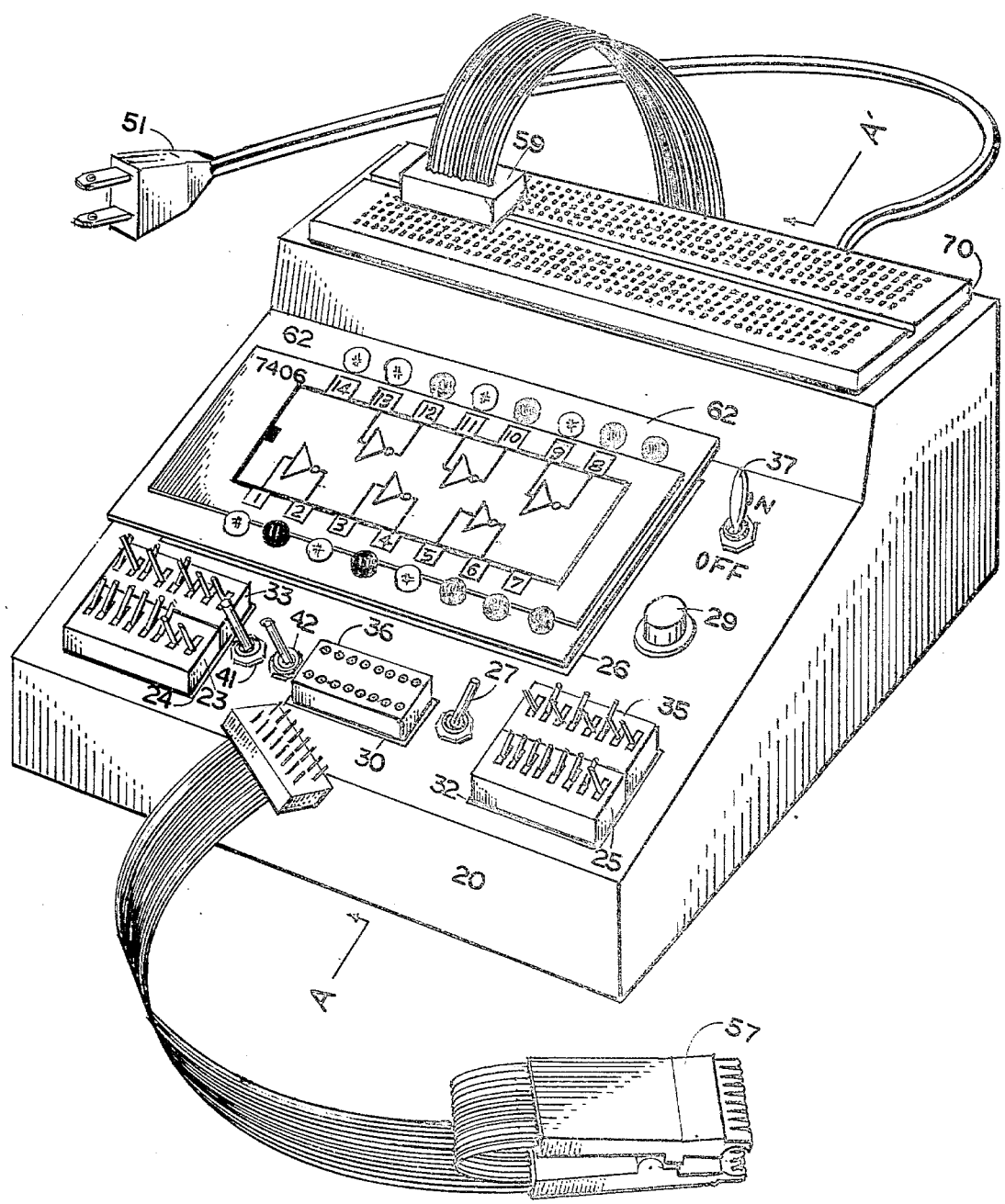
FIG. 1 is a side perspective view of the IC tester covered by the invention.
Figure 4:
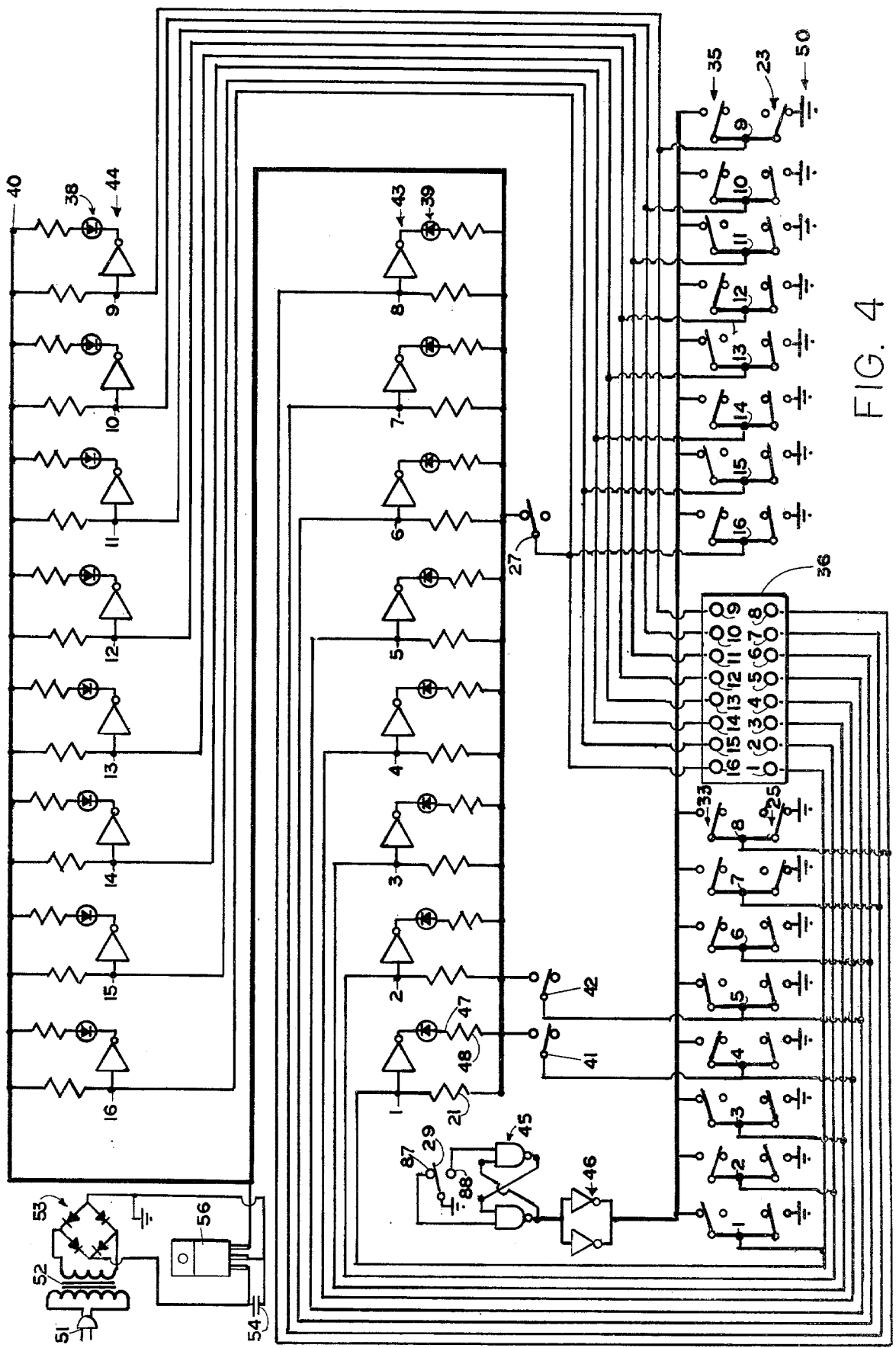
FIG. 4 is an electronic schematic diagram of the IC tester shown in FIG. 1.

Referring now to the drawings in particular, the invention embodied therein in FIG. 1 comprises a cabinet 20 serving to support and house various electronic components used in the construction of the invention, as shown in FIG. 4.

Turning to FIG. 4 a test socket 36 provides electrical connections 1 through 16 to the IC chip under test. Each of the electrical connections 1 through 16 is connected to a pair of switches such as low switches 23 and 25 and upper switches 33 and 34 operating in parallel. By use of the lower switches 23 and 25 any pin of the chip under test may be directly connected to ground by the operator. These switches therefore are used to provide ground to the chip under test and to appropriate input pins requiring logic "0" as input.

The upper row of switches, 33 and 35, serve to connect predetermined input pins to an input pulse signal following the action of a push button switch 29.

Nand gates 45, in connection with the pushbutton switch 29, serve to provide the debounced pulse introduced by the switches 33 and 34, to pin connections 1 through 16. The gates 45 form a latch which changes state from "0" to "1" and vice-versa upon the initial contract of the blade of switch 29 either on the terminal 87 or terminal 88. Bouncing of the blade on same terminal will not affect the state of the latch which will remain same until the blade touches the opposite side. The state of the output of one of the nand gates 45 is used as a debounced input pulse after being buffered by a pair of inverter gates 46.

Each of the pin connections 1 through 16 are directly connected to the input of an inverter gate, such as 43 and 44. The input to each of the inverter gates 43 and 44 is also connected to an operating voltage, circulated on a bus 40 through a resistor such as 21. Therefore, unless a pin is being grounded either through the lower switches, such as 23 and 25, or through the upper switches, such as 33 and 34, the logic state of the pin will remain "1".

The output of the inverter gates, such as 43 and 44, feeds one terminal of the LEDS such as 39 and 38, respectively. The other terminal of the LED, such as 47 is connected to the operating voltage on bus 40, through a current limiting resistor 48. The LED will be turned on if the output of the inverter gate, which is connected to the other side of the LED, is low, that is at logic state "0". Then the gate can sink the current flowing through the LED from the bus 40, at operating voltage, to ground. This means that the LED will be turned on if the logic state at the input to the inverter gate, which is also directly connected to the IC pin, is high, that is at logic state "1".

The operating voltage on bus 40 is generated from the AC line voltage connected through plug 51. The line voltage is being reduced to a few volts higher than the operating voltage, through a transformer 52. The reduced AC voltage is then rectified through a bridge 53. Preferably the positive output 55 is fed into a voltage regulator 56, which then provides a constant operating voltage to the bus 40.

Switches such as 41, 42 and 27 are used for direct connection of pins 4, 5 and 16, respectively to the operating voltage.

Figure 3:
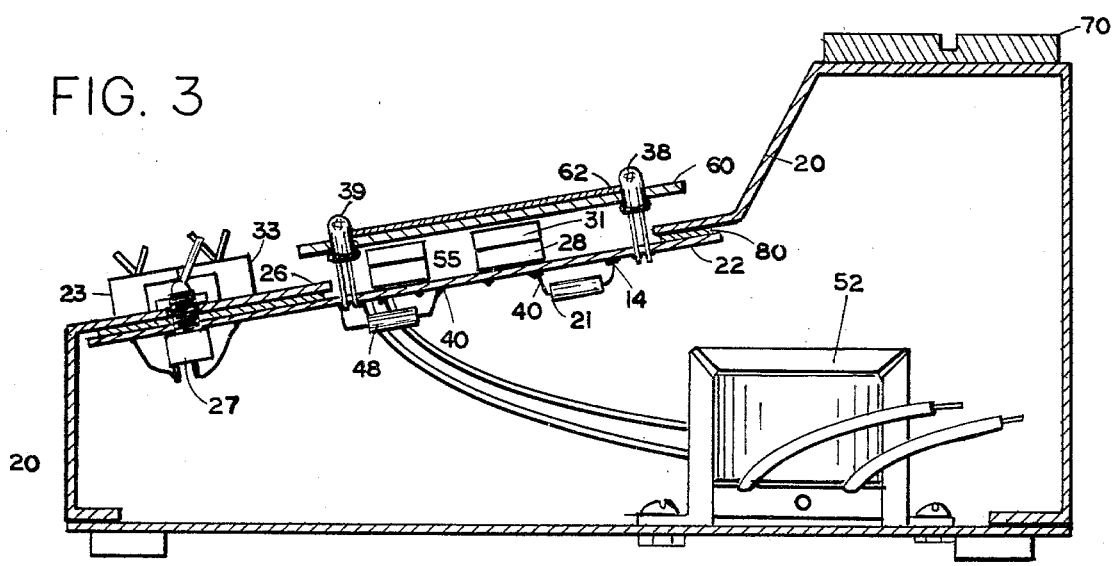
FIG. 3 is a cross sectional side elevation view of the IC tester, along the directional lines AA' shown in FIG. 1.

The electronic components described in connection with FIG. 4 are physically mounted on a single printed circuit board 22, which, in turn, is mounted on to the cabinet 20. Turning now to FIG. 3, the printed circuit board 22 is shown mounted on to the cabinet 20 by means of the toggle switches such as 42. Switches 42, 27, 29, and 37, not shown in FIG. 3, also serve to secure the printed circuit board 22 on to the cabinet 20. Windows such as 26 cut on the face of the cabinet 20, permit predetermined components which are mounted on the printed circuit board to protrude over the face of the cabinet. The window 26 is large enough to permit all the LEDs such as 38, 39 to protrude through the face of the cabinet 20. The two rows of LEDS are then used to support a light platform 60, with the LEDS pushed through corresponding holes on the platform. A card 62 providing a logic diagram of the IC unit under test is then supported by the platform 60 among the LEDS so that the significance of each pin is clearly displayed next to the logic state indicating LED.

Turning back to FIG. 1, the lower switches 23 and 25, for providing ground to any IC pin, are shown in the form of DIP switches 23 and 25; protruding through windows 24 and 32, respectively, on the face of the cabinet 20; while the upper switches, for connecting any IC pin to the debounced input pulse, are shown to be implemented in terms of DIP switches 33 and 34, also protruding through the windows 24 and 32, respectively. The switches for providing direct operating voltage to the chip under test are shown implemented in terms of toggle switches 41, 42 and 27, while the switch for introducing a pulse to predetermined pins is shown implemented by the pulse push button switch 29.

The IC diagram on the card 62 is shown supported by the light platform 60, which, in turn is physically supported by the LEDS themselves. The tester in FIG. 1 is shown set for testing a TTL IC chip number 7406 which provides 6 inverter gates. Since the 7406 chip has only 14 pins, the pair of pins at the right side of the socket 36 are not needed and are grounded. Ground is provided to the chip by grounding pin 7. Switch 27 is shown flipped up providing direct connection of pin 14 with the operating voltage. (In the case of chips with 14 pins, pins 10 through 16 are used as pins 8 through 14). The upper DIP switches are set to connect pins 1,3,5,9,11 and 13 with the debounced pulse signal generated by the operation of the push button switch 29. With the pulse providing a logic state "1" to the pins 1,3,5,9,11 and 13 the corresponding LEDS are shown lit up; while the pins 2,4,6,8,10 and 12 indicating the state of output of the inverters, are shown at logic state of "0", and therefore remain dark. The LED next to pin 14 and therefore remain dark. The LED corresponding to pin 14 remains lit because the pin is used to provide operating voltage to the chip and therefore is at logic state "1"; while the LED corresponding to pin 7 remains dark, as it provides ground to the chip, therefore remaining at logic "0".

When the push button switch 29 is pressed, the LEDs corresponding to pins 2 through 13 (except 7) will reverse state so the LED pattern will shift, indicating all gates to be good. The gates in which the input state changes but the output remains same are faulty.

The IC chip to be tested may be plugged into the socket 36 actually mounted on to the IC circuit board 22, but protruding through a window 30, cut on the face of the cabinet 20. An extension which can be plugged into the test socket 36 through the DIP plug 58, ending at a clip 57 can serve for easier insertion. Same clip 57 may also be used to clip over a chip operating in a finished circuit in conjunction with other chips during debugging stages. The logic state of the LEDS in line with the pin numbers and functional significance provided by the IC diagram card, can provide clues of the trouble.

A still another extension ending at a DIP plug 59 transfers the logic state of the pin connections 1 through 16 to a breadboard strip 70 mounted at the top level of the cabinet 20. The breadboard strip 70 then, can serve to enable testing of the IC chip in conjunction with other chips which are essential to its operation. For example a decoder feeding an LED display such as TTL number 7447 or 7448 can best be tested in conjunction with a decade counter chip such as the 74192, feeding an advancing binary number to the chip under test, while the output of the chip under test can feed a seven element decimal figure LED display.

The breadboard strip 70 in conjunction with the DIP extension 59 may also be used for general breadboarding purposes, as voltages at the pins of the extension 59 can be controlled by the DIP switches 23, 25, 33 and 35, providing logic states "0" and "1" and by the push button switch 29 providing a debounced pulse.

Figure 2:
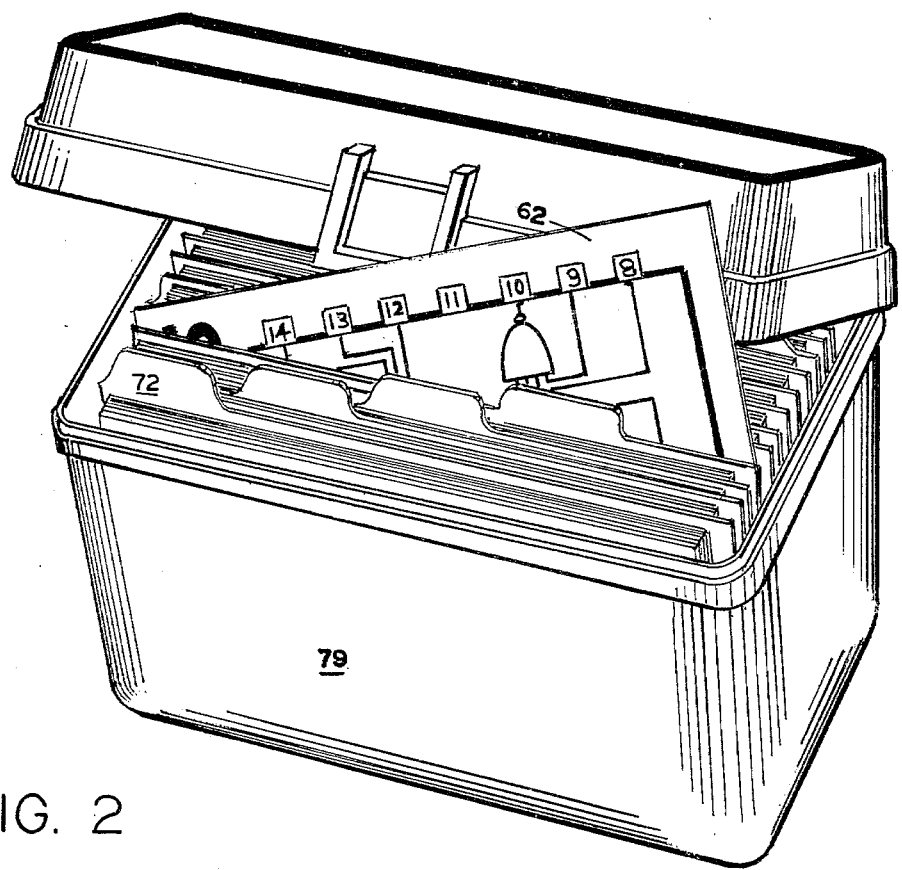
FIG. 2 is a side perspective view of a card file containing electronic diagrams used in connection with the IC tester shown in FIG. 1.

Turning now to FIG. 2 a file 79 provides space for filing the card logic diagrams 62, of the IC chips that can be tested by the invention. Index separators 72 help arrange the cards 60, numerically in accordance with a standard numbering system.

What is claimed is:

1. An integrated circuit tester comprising:
   a test socket means, having a predetermined number of pin stations for receiving an I.C. chip to be tested;
   logic state electronic detection means for detecting the logic state of each pin of said test socket means;
   luminous display means, driven by said logic state electronic detection means, for continuously indicating the logic state of pins;
   display card means, providing a logic diagram and showing the number and logic significance of each pin of the chip under test;
   display card supporting and positioning means for supporting and adjustment of said display card means, so that it can register next to said luminous display means, thereby providing correlation of the displayed logic states with the inherent logic operation of the chip under test;
   logic state adjusting means for setting a predetermined combination of pins of said test socket means to a logic value of "1" and "0", depending on the logic function and mode of operation of the chip under test.
   logic state pulsating means for temporarily switching the logic state of any combination of pins, of said test socket means, between the logic states "1" and logic state "0", and,
   power supply switching means for providing the power requirement of the chip under test such as ground and operating voltage to appropriate pins.

2. The device in claim 1 further comprising breadboarding means, and extension plugging means for communicating the logic state of each pin in said test socket means to said breadboarding means.

3. The device in claim 1, wherein said logic state adjusting means comprises DIP switching means.

4. The device in claim 1 wherein said logic state pulsating means comprises DIP switching means in conjunction with pulsating signal generating means.

5. The device in claim 1 wherein said luminous display means comprises light emitting diode means.

6. The device in claim 1 further comprising extention clamping means for electrically connecting the pins of an IC chip under test one by one, with the pins of said test socket means.

7. The device in claim 1 further comprising internal power supply means.

8. The device in claim 1 further comprising printed circuit means for supporting said test socket means, said logic state adjusting means, said logic state pulsating means, said logic state electronic detection means, said luminous display means and said display card supporting and positioning means.

9. The device in claim 8 further comprising a cabinet for supporting said printed circuit means.

10. The device in claim 1, wherein said display card supporting and positioning means are in turn physically supported by said luminous display means.

* * * * *